United States Patent
Kuriyagawa et al.

(10) Patent No.: US 8,729,556 B2
(45) Date of Patent: May 20, 2014

(54) DISPLAY DEVICE HAVING A WIRING OF LAMINATED LIGHT TRANSMITTING FILMS

(71) Applicants: Takeshi Kuriyagawa, Mobara (JP); Jun Fujiyoshi, Mobara (JP)

(72) Inventors: Takeshi Kuriyagawa, Mobara (JP); Jun Fujiyoshi, Mobara (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/792,404

(22) Filed: Mar. 11, 2013

(65) Prior Publication Data

US 2013/0193440 A1 Aug. 1, 2013

Related U.S. Application Data

(62) Division of application No. 13/085,517, filed on Apr. 13, 2011, now Pat. No. 8,409,891.

(30) Foreign Application Priority Data

Apr. 20, 2010 (JP) ................................. 2010-097034

(51) Int. Cl.
 *H01L 27/14* (2006.01)
(52) U.S. Cl.
 USPC ............................................. 257/72; 257/59
(58) Field of Classification Search
 USPC .................................................... 257/59, 72
 See application file for complete search history.

(56) References Cited

U.S. PATENT DOCUMENTS

| | | | |
|---|---|---|---|
| 7,948,167 B2 | 5/2011 | Chung et al. | |
| 8,148,259 B2 | 4/2012 | Arai et al. | |
| 2003/0201716 A1 | 10/2003 | Yamazaki et al. | |
| 2004/0164297 A1 | 8/2004 | Kaneko et al. | |
| 2004/0241931 A1* | 12/2004 | Akimoto et al. | 438/220 |
| 2004/0245923 A1 | 12/2004 | Park et al. | |
| 2005/0122442 A1* | 6/2005 | Park | 349/43 |
| 2005/0285987 A1 | 12/2005 | Azumada et al. | |
| 2007/0004062 A1 | 1/2007 | Yamazaki et al. | |
| 2009/0128723 A1* | 5/2009 | Saito et al. | 349/37 |
| 2009/0256477 A1* | 10/2009 | Chung et al. | 313/505 |
| 2010/0032186 A1 | 2/2010 | Gotou et al. | |

FOREIGN PATENT DOCUMENTS

| | | |
|---|---|---|
| JP | 2005-259371 | 9/2005 |
| JP | 2006-39509 | 2/2006 |
| JP | 2009-157200 | 7/2009 |

* cited by examiner

*Primary Examiner* — Bilkis Jahan
(74) *Attorney, Agent, or Firm* — Antonelli, Terry, Stout & Kraus, LLP.

(57) ABSTRACT

A display device in which a plurality of gate wires and a plurality of drain wires that intersect the gate wires are provided, and thin film transistors connected to the gate wires and the drain wires are formed for respective pixel regions. At least one of the gate wires, the drain wires, and lead wires drawn from the gate wires or the drain wires is formed of a light-transmitting patterned conductive film. The light-transmitting patterned conductive film is formed of at least a first light-transmitting patterned conductive film, and a second light-transmitting patterned conductive film laminated on the first light-transmitting patterned conductive film. The second light-transmitting patterned conductive film is formed of a conductive film for coating only the surface of the first light-transmitting patterned conductive film including its side wall surface.

9 Claims, 6 Drawing Sheets

DISPLAY DEVICE HAVING A WIRING OF LAMINATED LIGHT TRANSMITTING FILMS

CLAIM OF PRIORITY

This application is a divisional application of U.S. application Ser. No. 13/085,517, filed Apr. 13, 2011, now U.S. Pat. No. 8,409,891, the contents of which are incorporated herein by reference.

The present application claims priority from Japanese Patent Application JP 2010-097034 filed on Apr. 20, 2010, the content of which is hereby incorporated by reference into this application.

BACKGROUND

The present invention relates to a display device and a manufacturing method thereof, and particularly, to a display device using a light-transmitting conductive film.

Generally, a liquid crystal display device has a microfabricated electronic circuit formed on a surface at a liquid crystal side of one of paired substrates oppositely provided having the liquid crystal interposed therebetween. A display region (display portion) having a plurality of pixels arranged in matrix, and a peripheral circuit region (peripheral circuit portion) as a peripheral part of the display portion are formed on a surface of the other substrate at the liquid crystal side. The electronic circuits are provided in the display portion and the peripheral circuit portion.

The electronic circuit in the display portion includes at least a thin-film transistor for selecting a group of pixels arranged in rows, and a pixel electrode to which a video signal is supplied through the thin-film transistor. The electronic circuit in the peripheral circuit portion includes a large number of the thin-film transistors for generating a signal (scan signal) that drives the thin-film transistor of the display portion, and the video signal.

Each of the electronic circuits in the display portion and the peripheral circuit portion is configured by laminating a patterned conductive film, a semiconductor film, and an insulating film in this order. The electronic circuit in the display portion is connected to a drain wire and a gate wire provided in the display region having pixels formed. The electronic circuit in the peripheral circuit portion is connected to leading wires which extend from the drain wire and the gate wire in the display region so as to output the video signal and the scan signal to the drain wire and the gate wire via the leading wire. The electronic circuit in the peripheral circuit portion is configured to receive input of the data for displaying from an external device via a terminal portion. The terminal portion is connected to the peripheral circuit via a wiring (terminal wiring), through which the display data is input to the electronic circuit as disclosed in Japanese Unexamined Patent Publication Nos. 2006-39509 and 2009-157200.

The liquid crystal display device installed in the portable information terminal such as a cell phone has been demanded to achieve wide display region relative to the limited size of the casing, high-definition performance, and high-resolution property. For this, in the generally employed liquid crystal display device, the display region is widened by reducing the space occupied by a frame region that is not related to the image display (that is, narrow frame). Especially in the case where the electronic circuit in the peripheral circuit portion is not provided in the frame region, that is, the electronic circuit in the peripheral circuit portion is formed on the semiconductor chip installed in the terminal portion, the technique is employed for bringing the leading wire in the frame region into a multi-layer configuration to achieve the narrow frame, aiming at high-definition and high image quality as disclosed in Japanese Unexamined Patent Publication Nos. 2006-39509 and 2009-157200.

Generally, a metal film (thin metal film) is used for forming the leading wires in the frame region, and the drain and the gate wires provided in the display region for suppressing increase in the wiring load. The thin metal film exhibits low corrosion resistance, and accordingly, the material for forming the wiring layer to be provided at the position that is likely to be corroded has been demanded. It is therefore preferable to use the light transmitting conductive film such as ITO (Indium Tin Oxide) with corrosion resistance. However, the sheet resistance of the light-transmitting conductive film such as ITO is strong. If it is used for forming the wiring, the wiring resistance may be increased, causing the risk of increase in the wiring load.

When using the ITO with large sheet resistance as wiring, the wiring width may be increased. Such structure makes it difficult to realize the narrow frame. Meanwhile, the film thickness of ITO may also be considered. Generally, etching solution of oxalic acid is used after forming the light-transmitting conductive film as ITO so as to be processed into a desired pattern. In the process, the crystalline state of the light-transmitting conductive film needs to be non-crystalline (amorphous). If the light-transmitting conductive film is crystallized, it cannot be etched by the etching solution of the aforementioned type. When forming the light-transmitting conductive film with large film thickness, the resultant reaction heat allows easy crystallization. This is why the film thickness of the light-transmitting conductive film is limited, resulting in difficulty in formation of the light-transmitting conductive film with the film thickness larger than the predetermined value. The wiring formed using the light-transmitting conductive film generally tends to exhibit relatively large electric resistance.

SUMMARY

The present invention provides the display device which includes wirings and electrodes each formed of the light-transmitting conductive film for ensuring the reduced resistance.

The present invention further provides the manufacturing method of the display device provided with wirings and electrodes each formed of the light-transmitting conductive film with reduced electric resistance without increasing process steps.

(1) The present invention provides a display device in which a plurality of gate wires and a plurality of drain wires which intersect the gate wires are formed on a substrate, pixel regions are defined by the gate wires and the drain wires, and a thin film transistor connected to the gate wire and the drain wire is formed for each of the pixel regions. At least one of the gate wires, the drain wires, and a leading wire extending from the gate wire or the drain wire is formed of a light-transmitting patterned conductive film. The light-transmitting patterned conductive film is formed of at least a first light-transmitting patterned conductive film, and a second light-transmitting patterned conductive film laminated on the first light-transmitting patterned conductive film. The second light-transmitting patterned conductive film is formed of a conductive film for coating a surface of the first light-transmitting patterned conductive film including its side wall surface.

(2) The preset invention provides a manufacturing method of a display device having a thin film transistors in matrix formed on a substrate, including a first film forming step of forming a first light transmitting conductive film on a substrate, a first pattern step of providing a first light transmitting patterned conductive film in patterned crystallized state by subjecting the first light-transmitting conductive film to selective etching through a photolithography technique, a second film forming step of forming a second light-transmitting conductive film on the substrate, which coats the first light-transmitting patterned conductive film, and a second pattern step of providing a second light transmitting patterned conductive film on the first light-transmitting patterned conductive film in self-alignment by subjecting at least the second light-transmitting conductive film to wet etching.

The present invention provides the light-transmitting conductive film with reduced electric resistance without increasing process steps.

Other advantages of the present invention will clearly appear from the following description.

DESCRIPTION OF THE PREFERRED EMBODIMENT

Figure 1:
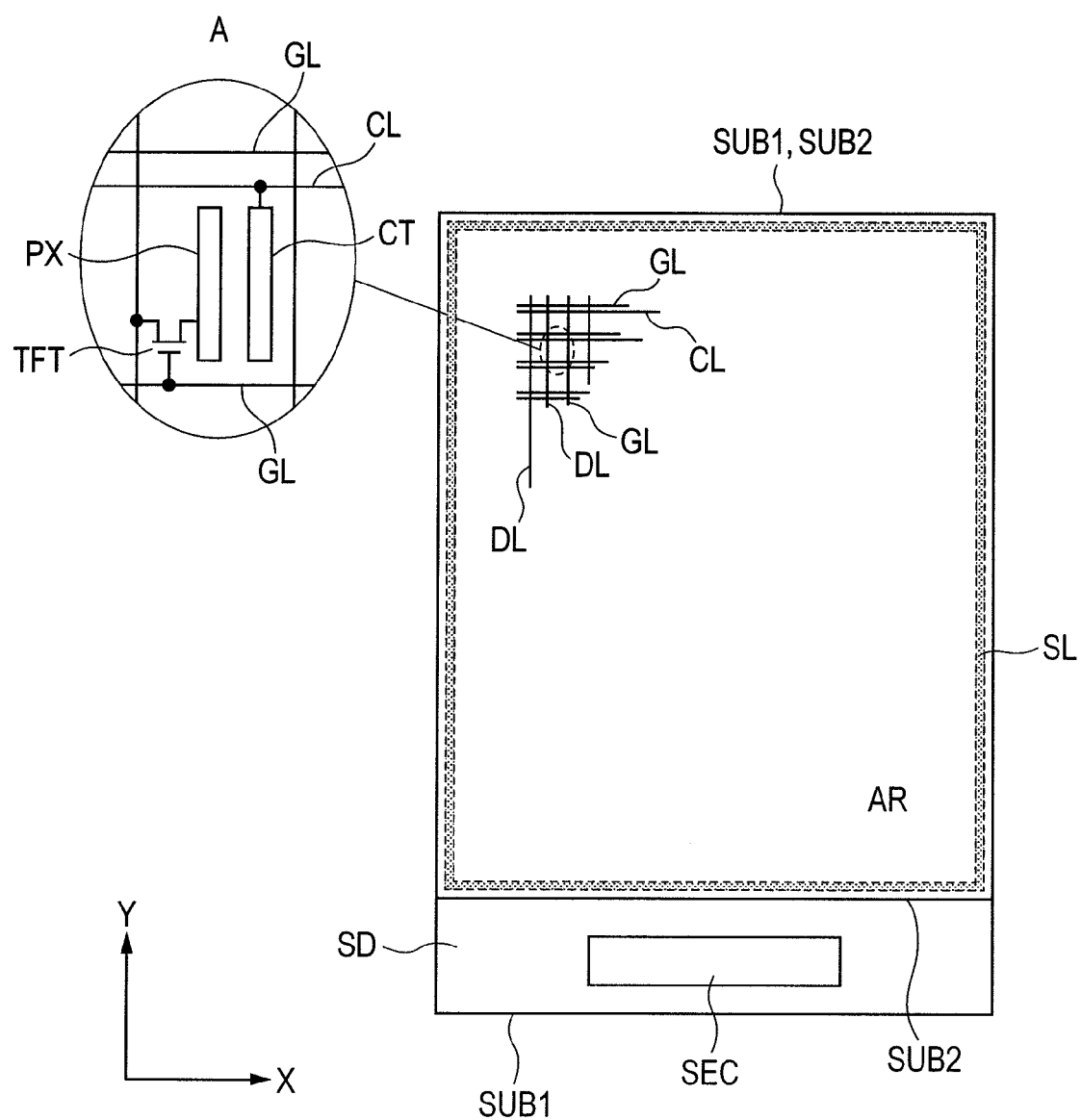
FIG. 1 is a plan view schematically illustrating a structure of a liquid crystal display device according to an embodiment of the present invention.

An embodiment of the present invention will be described referring to the drawings. The same components in the description are designated with the same reference numerals, and explanations thereof, thus will not be repeatedly described.

General Structure

FIG. 1 is a plan view schematically illustrating a liquid crystal display device according to an embodiment of the present invention. In the following description, the present invention is applied to the liquid crystal display device. However, it may be applied to other display devices such as an organic EL display device without limitation. Codes X and Y denote X-axis and Y-axis, respectively.

Referring to FIG. 1, a liquid crystal (not shown) is interposed between a first substrate SUB1 and a second substrate SUB2, which are oppositely arranged. The second substrate SUB2 is designed to face the user. A backlight (not shown) is provided on a back surface of the first substrate SUB1. The second substrate SUB2 has an area smaller than that of the first substrate SUB1 so that a lower peripheral portion SD of the first substrate SUB1 is exposed. A semiconductor device (chip) SEC is built in the lower peripheral portion SD of the first substrate SUB1. The semiconductor device SEC serves as a control circuit for driving respective pixels in a display region AR to be described later. A seal member SL is provided around the second substrate SUB2, which is bonded to the first substrate SUB1. The seal member SL functions in sealing the liquid crystal.

The region surrounded by the seal member SL is defined as the display region AR. On the surface of the display region AR of the first substrate SUB 1 at the liquid crystal side, gate wires GL each extending along X direction are aligned in Y direction, and drain wires DL each extending along Y direction are aligned in X direction. The region defined by adjacent paired gate wires GL and adjacent paired drain wires DL becomes a pixel region. The display region AR includes a large number of pixels arranged in matrix therein.

Referring to an enlarged part A indicating an equivalent circuit shown in a dotted elliptical frame, each pixel region includes a thin-film transistor TFT which is turned ON by a signal (scan signal) from the gate wire GL, a pixel electrode PX to which a signal (video signal) is supplied from the drain wire DL via the thin-film transistor TFT, and an opposite electrode CT for generating electric field between the opposite electrode CT and the pixel electrode PX. The electric field has a component parallel to the surface of the first substrate SUB1, and the liquid crystal molecules are designed to have the orientational state changed while being kept horizontal to the surface of the first substrate SUB1. The liquid crystal display device is referred to as transverse field type (IPS type). The opposite electrode CT is designed to receive a reference signal with respect to the video signal via the common wire CL which extends parallel to the gate wires GL.

The gate wires GL, the drain wires DL and the common wires CL are connected to the semiconductor device SEC via corresponding leading wires (not shown) so that the gate wires GL receive the scan signals, the drain signals DL receive the video signals, and the common wires CL receive the reference signals, respectively.

The aforementioned structure is shown by taking the liquid crystal display device of so called transverse field type as the example. However, the present invention may be applied to the liquid crystal display device of longitudinal type, for example, TN (Twisted Nematic), VA (Vertical Alignment) and the like.

Pixel Structure

Figure 2:
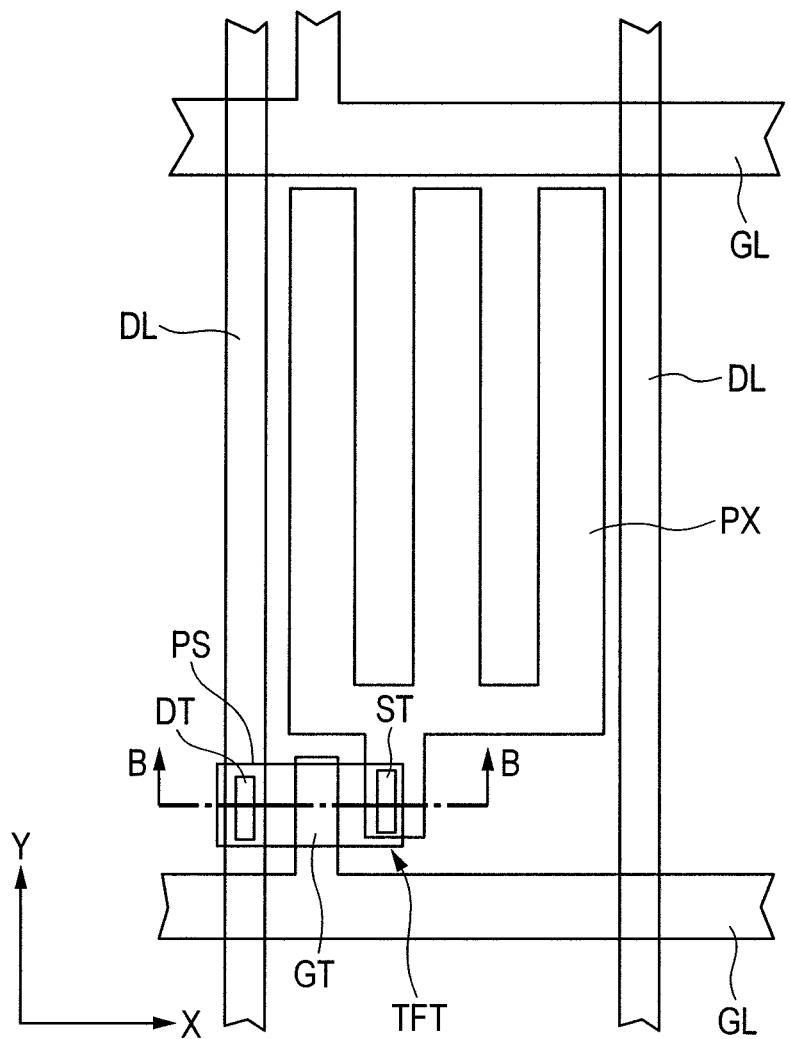
FIG. 2 is a view illustrating a structure of a pixel in a liquid crystal display device according to an embodiment of the present invention.
Figure 3:
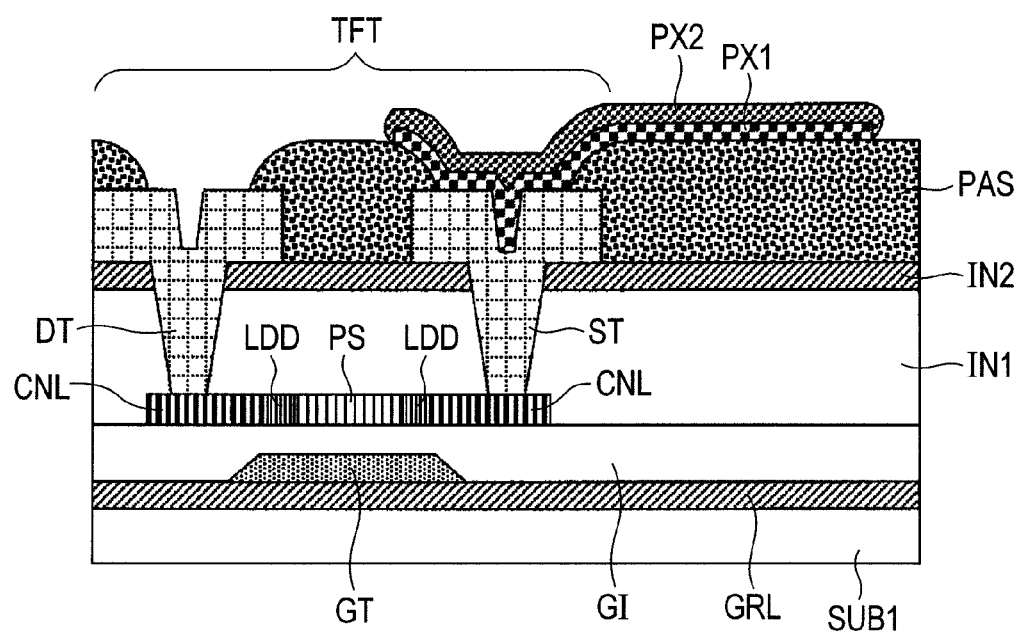
FIG. 3 is a sectional view taken along line B-B shown in FIG. 2.

FIG. 2 illustrates the pixel structure of the liquid crystal display device according to an embodiment of the present invention as a plan view corresponding to the part A shown in FIG. 1. FIG. 3 is a sectional view taken along line B-B shown in FIG. 2.

Referring to FIG. 2, a surface of the first substrate SUB1 at the liquid crystal side, that is, a main surface of the first substrate SUB1 (see FIG. 3) has a base layer GRL (see FIG. 3) formed thereon. The gate wires GL each extending along the X direction are aligned in Y direction on the upper surface of the base layer. Rectangular regions each as the pixel region are defined by those gate wires GL and the drain wires DL each extending along the Y direction which are aligned in the X direction. The gate wire GL is provided with a gate electrode GT formed as a protrusion projecting toward the pixel region. The gate electrode GT serves as a gate electrode for the thin-film transistor TFT.

Referring to FIG. 3, an insulating film GI which coats the gate wire GL (gate electrode GT) is formed on the surface of the first substrate SUB1 on which the gate wires GL are formed. The insulating film GI functions as a gate insulating film in the region for forming the thin-film transistor TFT.

The semiconductor layer (i layer) PS provided while superimposed with the gate electrode GT in the region for forming the thin-film transistor TFT on the surface of the insulating film GI is formed of a low temperature polysilicon (poly-Si) material. Low concentration impurity layers (LDD layer, n⁻layer) LDD doped with n-type impurity at low concentration are provided at the side of the drain electrode DT and the source electrode ST of the semiconductor layer PS while interposing the semiconductor layer PS. The low concentration impurity layer LDD provides the effect of mitigating field focusing between the semiconductor layer PS and the gate electrode GT. Contact layers CNL connected to the source electrode ST or the drain electrode DT are provided at the side of the drain electrode DT and the source electrode ST of the low concentration impurity layer LDD. The contact layer CNL is a high concentration impurity layer (n⁺layer) doped with high concentration n-type impurity. The contact layer CNL provides the effect of reducing the connection resistance between the source electrode ST or the drain electrode DT, and the channel region. The thin-film transistor TFT does not need to be limited to the coplanar type, but may be of staggered type. The gate electrode does not need to be limited to bottom type, but may be of top gate type.

A first insulating layer IN1 for coating the semiconductor layer PS, the low concentration impurity layers LDD and the contact layers CNL is formed on the upper surface of the first substrate SUB1. A second insulating film IN2 is further formed on the upper surface of the first insulating film IN1. Through holes (contact holes) which reach the contact layers CNL for interposing the semiconductor layer PS are formed in the first insulating film IN1 and the second insulating film IN2. The drain electrode DT and the source electrode ST are formed in the through hole for providing the thin-film transistor TFT. The drain wire DL (not shown) formed of, for example an aluminum thin film, is provided on the upper surface of the second insulating film IN2. The drain wire DL is electrically coupled with the drain electrode DT. The drain wire DL, the gate wire GL and the gate electrode GT may be formed of ITO film to be described later.

A protective film PAS which coats the drain electrode DT, the source electrode ST and the drain wires DL, and planarizes the surface of the first substrate SUB1 is formed on the upper layer of the second insulating film IN2. The protective film PAS serves to avoid direct contact with the thin-film transistor TFT, and prevents deterioration in characteristic of the thin-film transistor TFT. The protective film PAS has, for example a double layer structure, as a body formed by laminating the protective film formed of an inorganic insulating film and a protective film (planarized film) formed of an organic insulating film.

A first light-transmission patterned conductive film PX1 formed by pattern etching the light-transmitting conductive film through selective etching with a known photolithography technique is formed on the surface of the protective film PAS. A second light-transmitting patterned conductive film PX2 which coats the liquid crystal side surface (upper surface) and the side surface of the first light-transmitting patterned conductive film PX1 is formed. The pixel electrode PX is formed of the first light-transmitting patterned conductive film PX1 and the second light-transmitting patterned conductive film PX2. The second light-transmitting patterned conductive film PX2 is configured to coat the exposed surface of the first light-transmitting patterned conductive film PX1 including its side wall surface. Each of the first light-transmitting patterned conductive film PX1 and the second light-transmitting patterned conductive film PX2 is formed of a crystallized light-transmitting conductive film as described below.

In the embodiment, the opposite electrode CT is formed of the light-transmitting conductive film such as ITO (Indium Tin Oxide) over an entire area of the display region AR. A signal (reference signal) as a reference with respect to the video signal is supplied to the opposite electrode CT so that the signals are commonly supplied to the respective pixels. The opposite electrode CT is formed by directly laminating the common signal wires CL each formed of metal with low electric resistance so that the reference signal is supplied to the opposite electrode CT via the common signal wire CL. The common signal wire CL is formed adjacent or partially superimposed to the gate signal wire GL along the running direction thereof while avoiding substantial pixel region. The present invention is also applicable to the liquid crystal display device of VA type or TN type having the opposite electrode CT formed on the second substrate SUB2.

Pixel Producing Method 1

FIGS. 4 to 7 are explanatory views with respect to the manufacturing method of the liquid crystal display device according to the embodiment of the present invention. The method for producing the pixel electrode using the light-transmitting patterned conductive film according to the present invention will be described. The present invention is not limited to the pixel electrode, but may be applied to the drain wire DL and the gate wire GL each formed of the metal thin film to cope with high sheet resistance of the generally employed liquid crystal display device, the leading wiring for connecting those drain wire DL and gate wire GL to outputs of the semiconductor device SEC, and further to the electrode of the thin film transistor for forming the peripheral circuit. The manufacturing method according to the present invention is the same as that for manufacturing the generally employed display device except the process of producing the pixel electrode formed of the light-transmitting patterned conductive film. So the method for producing the pixel electrode formed of the light-transmitting patterned conductive film will be described in detail.

Figure 4:
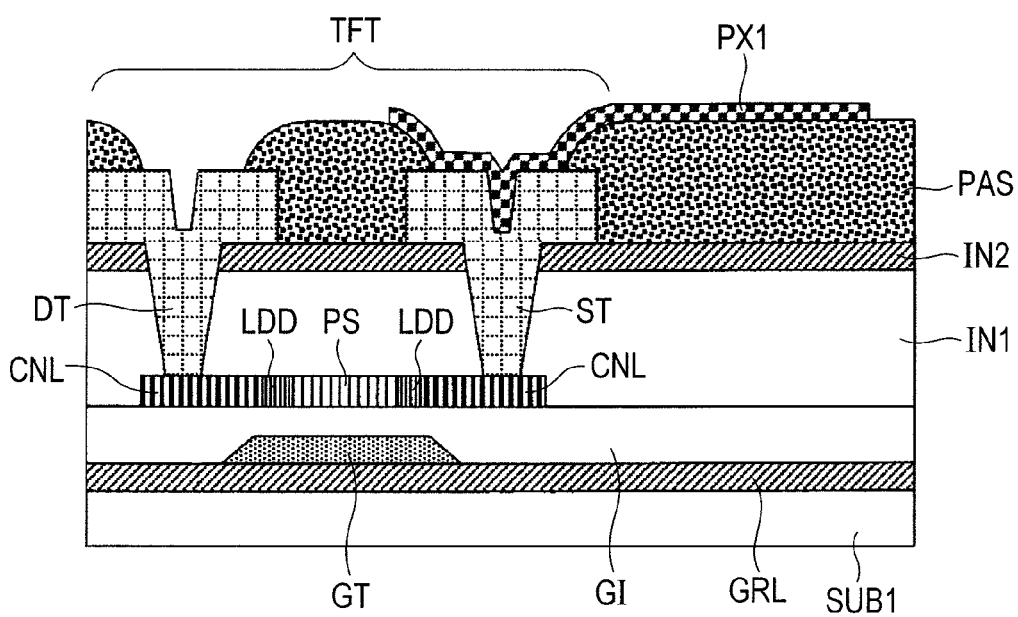
FIG. 4 is an explanatory view showing a manufacturing method of a liquid crystal display device according to an embodiment of the present invention.

In the process of forming the pixel electrode PX according to the embodiment, the ITO for forming the pixel electrode PX is subjected to pattern etching using the known photolithography technique to obtain the first light-transmitting patterned conductive film PX1, as shown in FIG. 4. In the process of forming the first light-transmitting patterned conductive film PX1, the ITO film ITO is formed on the surface of the first substrate SUB1 at the liquid crystal side, that is, the upper layer of the protective film PAS, and then the etching pattern is formed on the upper surface of the ITO film ITO. For example, the first light-transmitting patterned conductive film PX1 along the shape of the pixel electrode PX is formed through wet etching using chemical solution of oxalic acid. After the etching, the first light-transmitting patterned conductive film PX1 is in non-crystalline (amorphous) state. It is then subjected to the heat treatment such as the known annealing treatment to crystallize the etched first light-transmitting patterned conductive film PX1.

Figure 5:
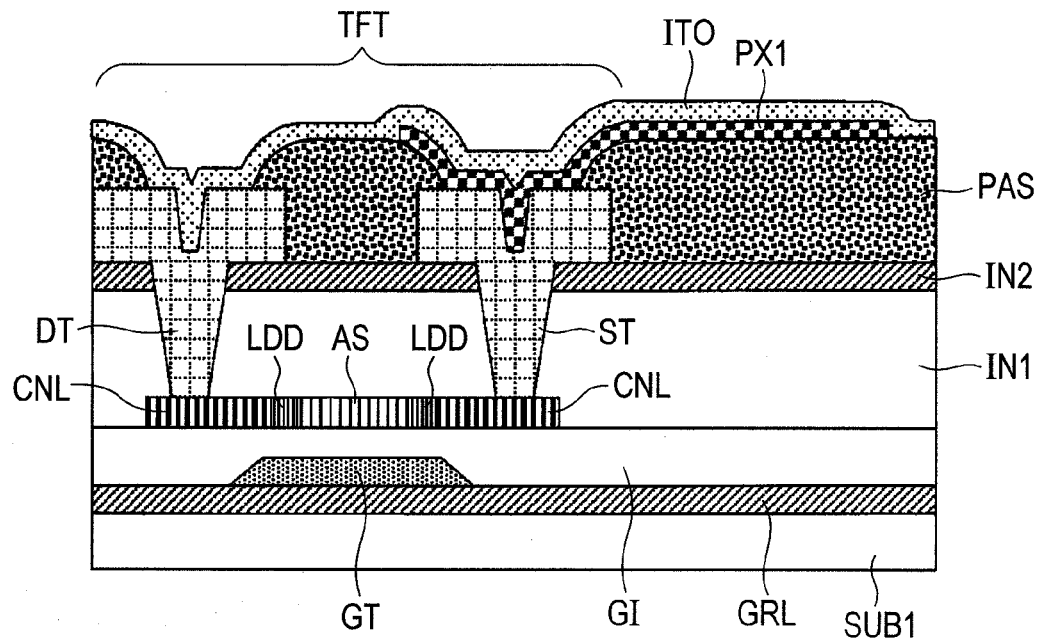
FIG. 5 is an explanatory view showing the manufacturing method of a liquid crystal display device according to the embodiment of the present invention.
Figure 6:
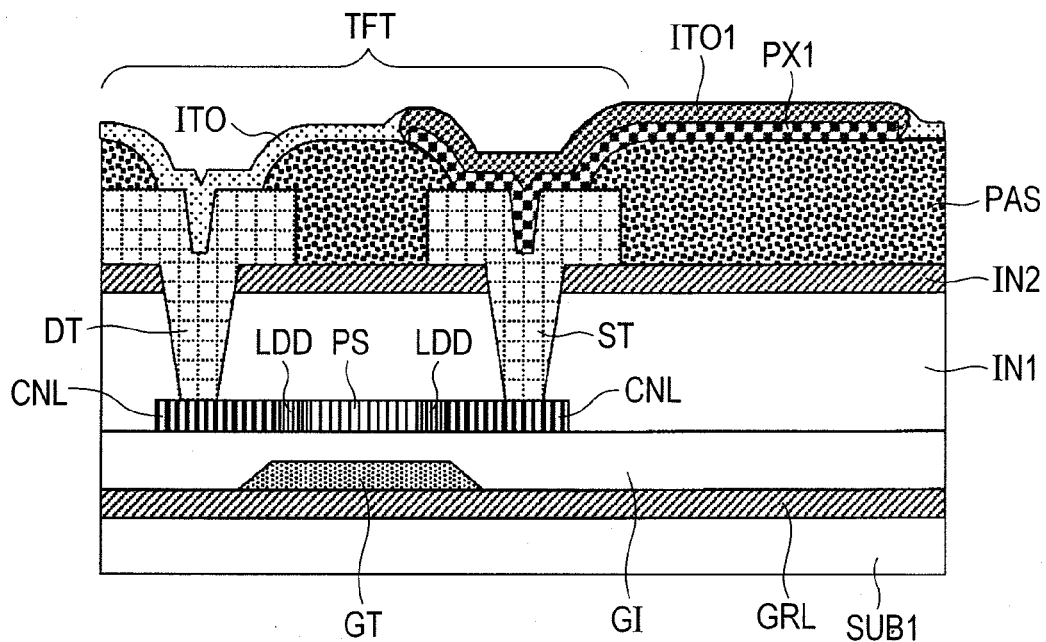
FIG. 6 is an explanatory view showing the manufacturing method of a liquid crystal display device according to the embodiment of the present invention.

Referring to FIG. 5, the ITO film ITO as the light-transmitting conductive film is formed on the liquid-crystal side surface of the first substrate SUB1, that is, the upper layer of the protective film PAS including the upper layer of the first light-transmitting patterned conductive film PX1. If the ITO film ITO is formed to have the thickness equal to or larger than the predetermined value, the ITO film in contact with both the upper and side surfaces of the first light-transmitting patterned conductive film PX1, that is, the exposed surface of the first light-transmitting patterned conductive film PX1 is brought into the ITO film ITO1 under the reaction heat in the crystallized state.

Figure 7:
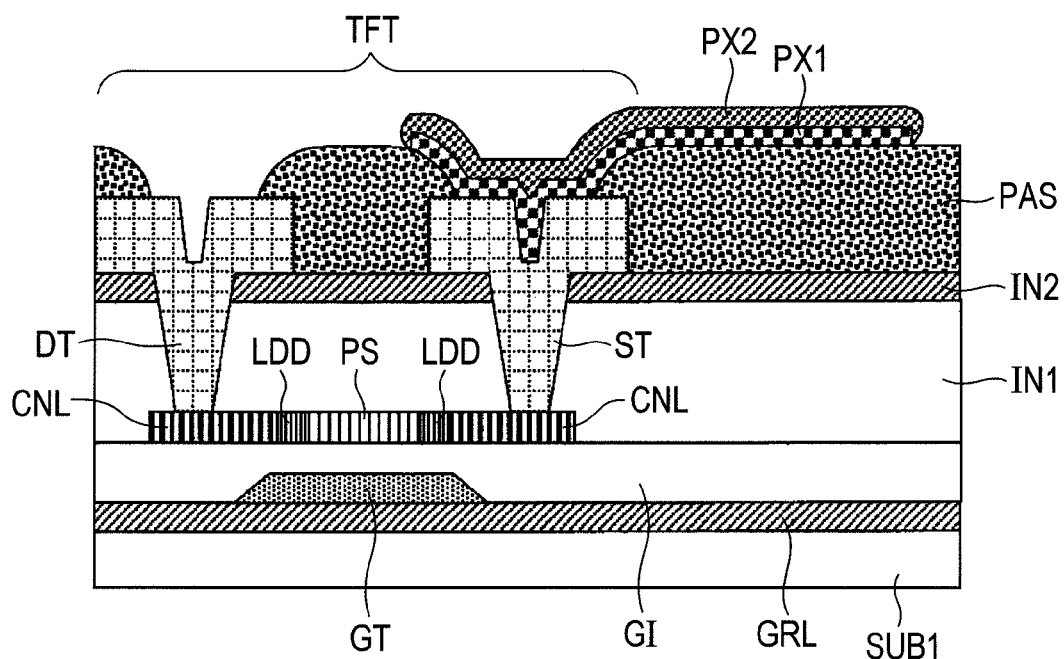
FIG. 7 is an explanatory view showing the manufacturing method of a liquid crystal display device according to the embodiment of the present invention.
Figure 13:
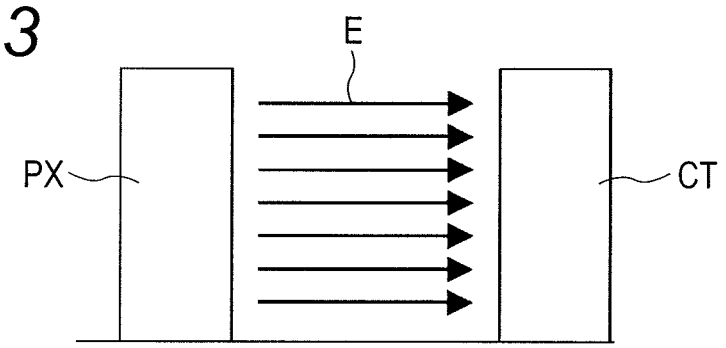
FIG. 13 is a view illustrating an electric field distribution for driving the liquid crystal between a pixel electrode and an opposite electrode of the liquid crystal display device according to the embodiment of the present invention.

In the embodiment, the ITO film ITO is subjected to the wet etching again using the chemical solution of oxalic acid. The chemical solution of oxalic acid serves to etch only the ITO film ITO in the non-crystallized state. As a result, the ITO film ITO1 in the crystallized state is kept un-etched as illustrated in FIG. 7. As clearly shown in FIG. 7, the second light-transmitting patterned conductive film PX2 along the shape of the upper and side surfaces of the first light-transmitting patterned conductive film PX1 is formed in self-alignment, thus defining the pixel electrode PX. The pixel electrode PX is formed by laminating the second light-transmitting patterned conductive film PX2 on the first light-transmitting patterned conductive film PX1, and the resultant thickness is larger than that of the generally employed pixel electrode PX. This makes it possible to reduce the electric resistance of the transparent conductive film for forming the pixel electrode PX. Reduction of the electric resistance of the pixel electrode PX makes the field distribution within the pixel electrode PX uniform, thus further making distribution of electric field E for driving the liquid crystal between the pixel electrode PX and the opposite electrode CT uniform as shown in FIG. 13. As a result, brightness difference in the same pixel may be significantly reduced. Reduction of the brightness difference in the same pixel is especially effective for the reduced gap between electrodes accompanied with high-definition of the liquid crystal display device. This is usable as the electrode of isotropic crystal demanded by the transverse electric field type.

In the case where the ITO film ITO formed on the upper layer of the first light-transmitting patterned conductive film PX1 has the thickness equal to or smaller than the predetermined value, crystallization under the reaction heat resulting from the film-forming process does not occur. The ITO film ITO1 is thus kept non-crystallized. In this case, the crystallized ITO film ITO may be formed through annealing treatment using a laser beam, for example. The wet etching using the chemical solution of oxalic acid forms the second light-transmitting patterned conductive film PX2 to be laminated on the first light-transmitting patterned conductive film PX1, resulting in the aforementioned effect.

Wiring Producing Method

FIGS. 8 to 12 are explanatory views with respect to application of the transparent conductive film to the wiring layer in the liquid crystal display device according to the embodiment of the present invention. The manufacturing method and effect resulting from application of the present invention to the wiring production will be described referring to FIGS. 8 to 12. In the following description, the wiring layer is formed on the upper surface of the first substrate SUB1. However, the wiring layer may be formed on the upper layer of the second insulating film as the other insulating layer likewise production of the pixel electrode PX. In the explanation to be described below, a three-layer light-transmitting patterned conductive film is formed to significantly reduce the electric resistance of the wiring layer. Like the pixel electrode PX, the light-transmitting patterned conductive film is not limited to the three-layer configuration so long as two or more layers are used.

Figure 8:
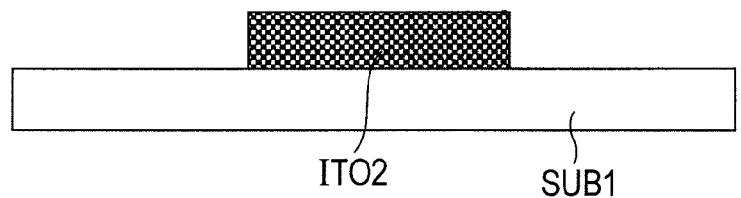
FIG. 8 is an explanatory view representing a manufacturing method of the liquid crystal display device according to an embodiment of the present invention having a wiring layer formed of a transparent conductive film.

After forming the ITO film on the upper surface (liquid crystal side) of the first substrate SUB1, and the wiring mask pattern is formed so that the ITO film is wet etched using the chemical solution of oxalic acid. The ITO film ITO2 in non-crystallized state is formed through the etching as shown in FIG. 8. Thereafter, the ITO film ITO2 in the non-crystallized state is subjected to the heat treatment such as annealing treatment to form a first light-transmitting patterned conductive film ITO3 as the crystallized ITO film.

Figure 9:
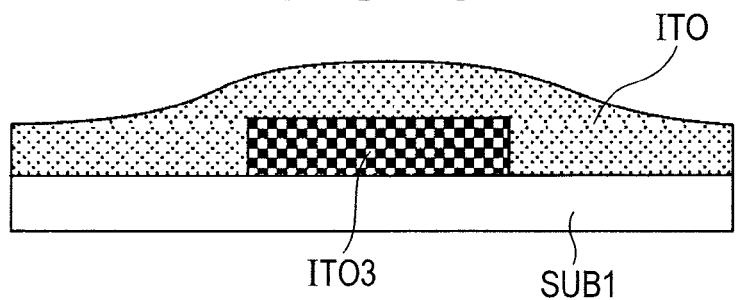
FIG. 9 is an explanatory view representing the manufacturing method of the liquid crystal display device according to the embodiment of the present invention having a wiring layer formed of a transparent conductive film.
Figure 10:
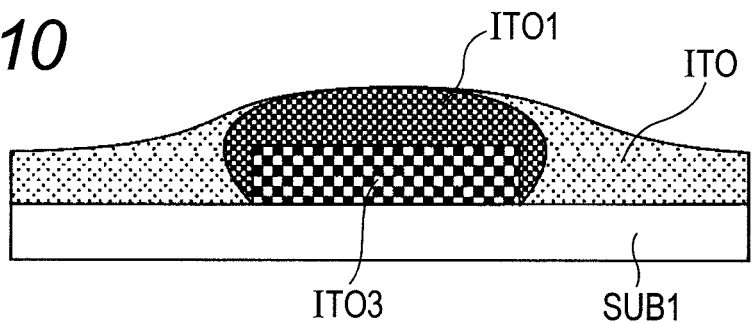
FIG. 10 is an explanatory view representing the manufacturing method of the liquid crystal display device according to the embodiment of the present invention having a wiring layer formed of a transparent conductive film.
Figure 11:
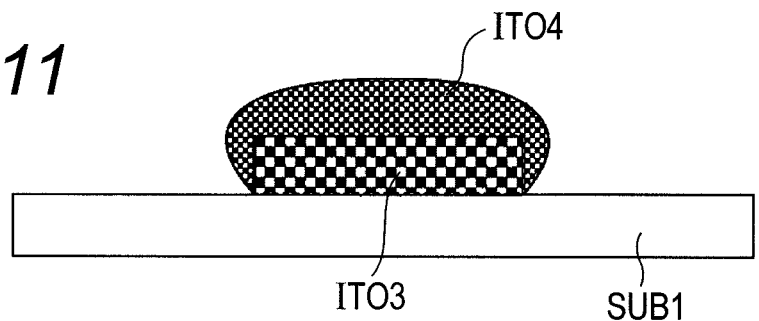
FIG. 11 is an explanatory view representing the manufacturing method of the liquid crystal display device according to the embodiment of the present invention having a wiring layer formed of a transparent conductive film.
Figure 12:
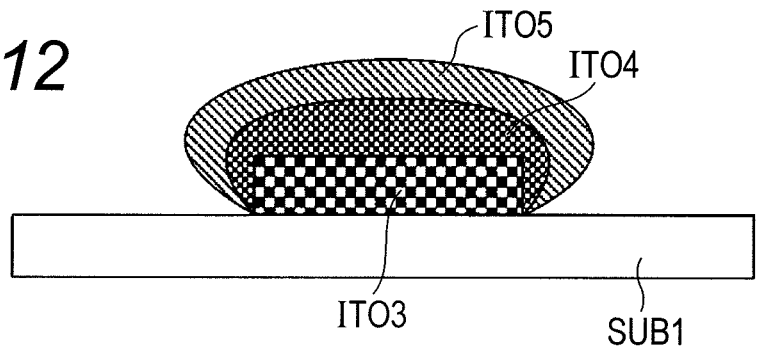
FIG. 12 is an explanatory view representing the manufacturing method of the liquid crystal display device according to the embodiment of the present invention having a wiring layer formed of a transparent conductive film.

Referring to FIG. 9, the ITO film ITO is formed on the surface of the first substrate SUB1 so that the film thickness becomes equal to or larger than the predetermined value. Under the reaction heat generated in the film-forming process step, the ITO film ITO around the crystallized first light-transmitting patterned conductive film ITO3 is brought into the crystallized ITO film ITO1 as shown in FIG. 10.

The ITO film ITO is subjected to the wet etching using the chemical solution of oxalic acid so that a second light-transmitting patterned conductive film ITO4 as the crystallized ITO film is formed. The second light-transmitting patterned conductive film ITO 4 is the light-transmitting patterned conductive film having only the crystallized ITO film ITO1 kept un-etched as shown in FIG. 10. The second light-transmitting patterned conductive film ITO4 may be formed in self-alignment along the shape of the upper and side surfaces of the first light-transmitting patterned conductive film ITO3 without using the photolithography technique.

The ITO film is formed on the upper surface of the first substrate SUB1 that contains the second light-transmitting patterned conductive film ITO4 again so that the upper and the side surfaces of the second light-transmitting patterned conductive film ITO4 are crystallized under the reaction heat as described above. The ITO film is subjected to the wet etching using the chemical solution of oxalic acid to etch the non-crystallized ITO film ITO. This makes it possible to form a third light-transmitting patterned conductive film ITO5 in crystallized state in self-alignment. In this way, the wiring layer is formed of a three-layer light-transmitting patterned conductive film including ITO3, ITO4 and ITO5. The resultant wiring layer is capable of reducing the electric resistance to the degree greater than the wiring layer formed of a single layer of the light-transmitting patterned conductive film.

As described above, in the liquid crystal display device according to the embodiment of the present invention, the first light-transmitting patterned conductive film is formed on the surface at the liquid crystal side of the first substrate SUB1. The first light-transmitting patterned conductive film is subjected to selective etching through the photolithography technique so as to form the patterned crystallized first light-transmitting patterned conductive film. The second light-transmitting patterned conductive film is formed to coat the first light-transmitting patterned conductive film, and is at least further subjected to the wet etching so as to be formed on the first light-transmitting patterned conductive film in self-alignment. The light-transmitting patterned conductive layers may be easily laminated after forming the first light-transmitting patterned conductive film without using the photolithography technique, that is, without increasing process steps. As a result, the electric resistance of the light-transmitting patterned conductive film may be significantly reduced. This makes it possible to easily use the light-transmitting patterned conductive film for forming the wiring layer which has been conventionally formed of the metal thin film. The light-transmitting patterned conductive layer may be formed of a plurality of films including the first, second and third light-transmitting patterned conductive films so as to increase the pattern width of the light-transmitting patterned conductive film, thus further reducing the electric resistance.

The present invention has been described in specific way in reference to an embodiment. It is to be clearly understood that the invention is not limited to the above-described embodiment, but may be subjected to various modifications without departing from the scope of the present invention.

What is claimed is:

1. A display device in which a plurality of gate wires and a plurality of drain wires which intersect the gate wires are formed on a substrate, pixel regions are defined by the gate wires and the drain wires, and a thin film transistor connected to the gate wire and the drain wire is formed for each of the pixel regions,
wherein at least one of the gate wires, the drain wires, a gate leading wire extending from the gate wire and a drain leading wire extending from the drain wire is formed of a light-transmitting patterned conductive film;
the light-transmitting patterned conductive film is formed of at least a first light-transmitting patterned conductive film, and a second light-transmitting patterned conductive film laminated on the first light-transmitting patterned conductive film;
the second light-transmitting patterned conductive film coats an upper surface of the first light-transmitting patterned conductive film including a step portion forming the upper surface of the first light-transmitting patterned conductive film and a side wall surface of the first light-transmitting patterned conductive film; and
wherein the first light-transmitting patterned conductive film and the second light-transmitting patterned conductive film are crystallized.

2. The display device according to claim 1, wherein the second light-transmitting patterned conductive film has a section orthogonal to an extending direction larger than a width of the first light-transmitting patterned conductive film.

3. The display device according to claim 1, wherein the second light-transmitting patterned conductive film has a section orthogonal to an extending direction larger than a width of the first light-transmitting patterned conductive film.

4. The display device according to claim 1, wherein the first light-transmitting patterned conductive film is formed on and in physical contact with an insulating film,
the second light-transmitting patterned conductive film is not in physical contact with the insulating film.

5. The display device according to claim 4, wherein the insulating film coats a source electrode and a drain electrode of the thin film transistor.

6. The display device according to claim 4, wherein the insulating film is an organic insulating film.

7. The display device according to claim 1, wherein the first light-transmitting patterned conductive film is formed on and in physical contact with a insulating film,
the second light-transmitting patterned conductive film is not in physical contact with the insulating film.

8. The display device according to claim 7, wherein the insulating film coats a source electrode and a drain electrode of the thin film transistor.

9. The display device according to claim 7, wherein the insulating film is an organic insulating film.

* * * * *